United States Patent [19]

Mugiya et al.

[11] Patent Number: 4,868,639
[45] Date of Patent: Sep. 19, 1989

[54] SEMICONDUCTOR DEVICE HAVING WAVEGUIDE-COAXIAL LINE TRANSFORMATION STRUCTURE

[75] Inventors: Hiroshi Mugiya, Tama; Mitsuo Hasegawa, Kawasaki; Youichi Arai, Machida, all of Japan

[73] Assignee: Fujitsu Limited, Kawasaki, Japan

[21] Appl. No.: 83,386

[22] Filed: Aug. 10, 1987

[30] Foreign Application Priority Data

Aug. 11, 1986 [JP] Japan .................... 61-186952
Sep. 26, 1986 [JP] Japan .................... 61-227595

[51] Int. Cl.⁴ .................... H01L 23/02; H01L 23/16
[52] U.S. Cl. .................... 357/74; 357/75; 357/81
[58] Field of Search ............... 357/74, 75, 81

[56] References Cited

U.S. PATENT DOCUMENTS

| 4,069,498 | 1/1978 | Joshi ............ 357/80 |
| 4,229,758 | 10/1980 | Ikari ............ 357/74 |
| 4,352,119 | 9/1982 | Bardens et al. ............ 357/74 |
| 4,453,033 | 6/1984 | Duff et al. ............ 357/74 |
| 4,706,106 | 11/1987 | Shiba et al. ............ 357/74 |

FOREIGN PATENT DOCUMENTS

| 52-53664 | 4/1977 | Japan ............ 357/74 |
| 55-22819 | 2/1980 | Japan ............ 357/74 |

Primary Examiner—Rolf Hille
Assistant Examiner—Gregory Key
Attorney, Agent, or Firm—Armstrong, Nikaido, Marmelstein, Kubovcik & Murray

[57] ABSTRACT

In a semiconductor device which has an air tight metal package containing a high frequency wave range circuit element and which has a waveguide-coaxial line transformation structure, a metal terminal for the waveguide-coaxial line is air-tightly attached directly in a hole of a base of the metal package with a dielectric spacer, usually by glass fusion, whereby the thickness of the base may be reduced and attachment of the terminal to the base is simplified.

23 Claims, 5 Drawing Sheets

SEMICONDUCTOR DEVICE HAVING WAVEGUIDE-COAXIAL LINE TRANSFORMATION STRUCTURE

BACKGROUND OF THE INVENTION

1. Field of the Invention

The present invention relates to a semi-conductor device, more specifically a semiconductor device having an air-tightly sealed package containing a circuit element therein and a waveguide connected with the package, in which the semiconductor device has a waveguide-coaxial line transformation structure.

2. Description of the Related Art

FIGS. 1 and 2 show perspective and sectional views of a conventional semiconductor device having an air-tightly sealed package containing a high frequency range circuit, e.g., an oscillator or an amplifier, which operates at a microwave range, and a waveguide attached to the package. FIGS. 1 and 2 are perspective and sectional views of the package. In these figures, 1 denotes a body or base of the package, 2 a cap of the package, 3 a waveguide-coaxial line transforming high frequency input terminal, 4 a terminal for a power source, 5 a terminal for internal control, 6 an IF (intermediate frequency) output terminal, 7 a semi-conductor circuit, and 8 a waveguide. In such a semiconductor device, the semiconductor circuit 7 is mounted on the base 1 of the package, the cap 2 is air-tightly (hermetically) sealed to the base 1 for protecting the semiconductor circuit 7, and the package is then attached to the waveguide 8.

To attach terminals 3 to 6 to the base 1, ready-made hermetically-glass-sealed terminals 3 to 6 are bonded to bore portions of the base 1 with a solder 9, a conductive resin, or the like. In FIGS. 5 and 6, 1′ denotes a metal terminal, 2′ a metal ring and 3′ a glass dielectric spacer. Ready-made hermetically glass-sealed-terminals are used because, particularly for a waveguide-coaxial line transforming terminal, the shape of the terminal, the material and shape of the glass, etc., are severely limited when microwave impedance matching, prevention of radiation at the waveguide-coaxial converting part, etc., are considered. Also, because a glass-metal matching method is used, the materials of the metal members are limited from the viewpoints of heat resistance and bonding strength to glass. As a result, a terminal which fulfills the above requirements or conditions and can be easily attached to a base or body of a package is required.

The formation of terminals using a ready-made hermetically- glass-sealed terminal has, however, the following problems:

(1) The formation of bores of a base at which a hermetically sealed terminal is to be attached requires cutting or other complicated machining due to the complicated shape of the bores made necessary because the hermetically sealed terminal must be air-tightly fixed to the base.

(2) In order to attach the hermetically sealed terminal, the thickness of a base of a package must be thick.

(3) With regard to the above item (2), a simple method such as punching can not be used to bore a hole in a base of a package.

(4) To maintain an air tight state between a hermetically sealed terminal and a base of a package, each terminal must be processed, for example, rotated, to ensure the bonding of the terminal to the base. This makes the batch process difficult. Also, this may sometimes result in a climb-up (creepage) of a solder from the interstice between a terminal and a base, causing a short circuit.

SUMMARY OF THE INVENTION

To solve the above problems, according to the present invention, terminals are formed as an integrated structure of a base of a package and a terminal, and then a semiconductor circuit is mounted on the base and a cap is sealed. Thus, the steps of soldering, etc., are eliminated and the cost of a semiconductor device is reduced.

The present invention provides a semiconductor device comprising: a metal base of a package, having a hole passing through the base; a semiconductor circuit element mounted on the base; a cap of the package fixed air-tightly to the base for sealing the circuit element within the package; a metal terminal for waveguide-coaxial line transformation, passing through the hole of the base and having an inner end portion at which the terminal is electrically connected to the circuit element, a central transformation portion in the hole of the base, and an outer antenna portion extending toward the outside of the package; and a dielectric spacer between the terminal and the base, the terminal being air-tightly fixed directly to the base by the dielectric spacer; wherein the structure of the hole of the base, the dielectric spacer, and the central transformation portion of the terminal is formed in such a way that the whole acts as a required waveguide-coaxial line transformer.

In a high frequency wave waveguide-coaxial line transforming structure, (1) a material (dielectric constant and matching to metal), a shape and a volume of glass, and (2) a shape giving a high transformation efficiency, of a transformation portion are selected to prevent radiation and to meet various factors such as microwave impedance. Then, the terminal for waveguide-coaxial line transformation as well as the other terminals are inserted in holes of a package and the terminals are made into an integrated structure with the package base by a glass fusing method using an electric furnace, etc.

By forming an integrated structure of a waveguide-coaxial line transformation of a terminal and a package base: (1) the thickness of the package base can be made thinner, allowing a machining process such as punching to be used for boring; (2) the steps of soldering, etc., of the hermetically sealed terminals become unnecessary, eliminating problems including seal breakage and short circuiting due to an inaccurate attachment of the terminals to the base, and as a result, the reliability of air-tight seal is improved; and (3) the semiconductor devices can be made smaller and lighter in weight and mass productivity remarkably improved. As a result, the cost for the production of a semiconductor device is reduced.

DESCRIPTION OF THE PREFERRED EMBODIMENTS

FIGS. 7 to 10 show a semiconductor device according to the present invention and correspond to FIGS. 1 to 4 respectively. In FIGS. 7 to 10, 12 denotes a cap of a package, 17 a semiconductor circuit element, and 18 a waveguide, which members are the same as or similar to those in FIGS. 1 to 4, 21 denotes a body or base of a package, 23 a waveguide-coaxial line transforming high frequency input (or output) terminal, 24 a terminal for a power source, 25 a terminal for internal control, and 26 an IF output (or input) terminal. The semiconductor device according to the present invention is characterized in that the terminals 23 to 26 are not ready-made hermetically sealed terminals as in the prior art, but are made by forming holes in the metal base 21 of the package, inserting metal terminals in the holes, respectively, and integrating the terminals with the base 21 by glass fusion.

As described previously, particularly in the waveguide-coaxial line transformation structure, the selection of the material and the shape of glass, and the configuration of the transformation portion, etc., are important for the prevention of radiation and to cope with factors such as microwave impedance, etc. However, in the present invention, this selection can be made in accordance with substantially the same selection methods of selection criteria as used for the hermetically sealed terminals of the prior art. Since in the present invention, an outer metal ring is not used as in a conventional hermetically sealed terminal, selection of the material of the package base is limited by the criteria for the outer metal ring in addition to the criteria for the package base itself. However, the limitation of the material of the package base can be compensated by changes of the glass material and the configuration of the transformation portion, if necessary.

In a waveguide-coaxial line transformation structure comprising a metal base having a hole, a metal terminal passing through the hole, and a dielectric spacer in the hole between the metal base and the metal terminal, the following formula should be satisfied:

$$Z_0 = \frac{60}{\epsilon} \log_e \frac{d_2}{d_1}$$

where $Z_0$ is a required inherent impedance of a characteristic frequency, $\epsilon$ is a dielectric constant of the dielectric spacer, $d_1$ is a diameter of a portion, in the hole, of the terminal, and $d_2$ is a diameter of a portion, enclosing the above portion of the terminal having the diameter $d_1$, of the hole.

The portion of the terminal having the diameter $d_1$ in the above formula may correspond to only a part of the hole.

Figure 1:
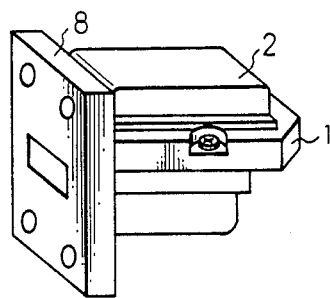
FIG. 1 is a perspective view of a prior art semiconductor device.
Figure 2:
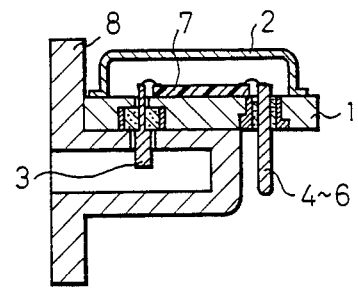
FIG. 2 is a sectional side view of a semiconductor device of FIG. 1.
Figure 3:
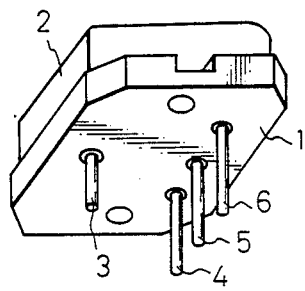
FIG. 3 is a perspective view of the body of the semiconductor device of FIG. 1, the waveguide being removed in this figure.
Figure 4:
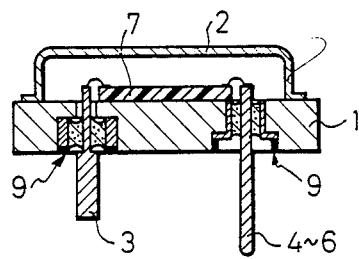
FIG. 4 is a sectional side view of the device of FIG. 3.
Figure 5:
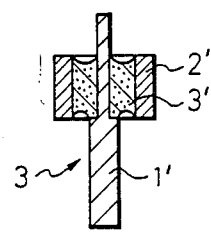
FIG. 5 is a sectional side view of a hermetically sealed terminal for waveguide-coaxial line transformation in the prior art.
Figure 6:
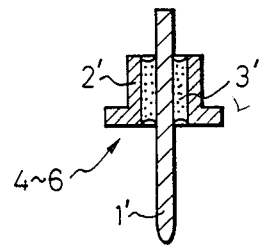
FIG. 6 is a sectional side view of a hermetically sealed terminal for a power source in the prior art.
Figure 7:
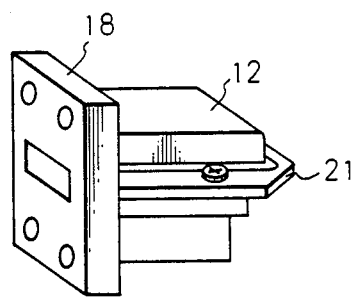
FIG. 7 is a perspective view of a semiconductor device according to the present invention.
Figure 8:
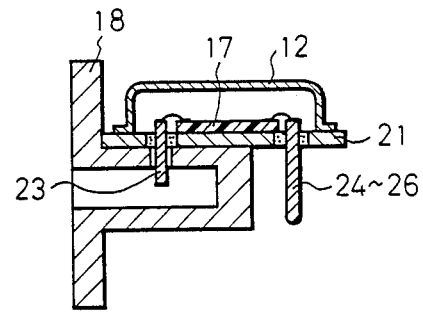
FIG. 8 is a sectional side view of the semiconductor device of FIG. 7.
Figure 9:
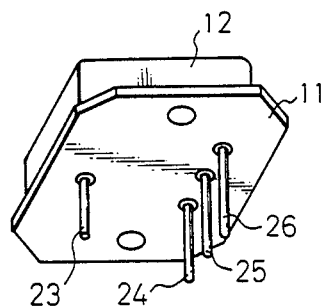
FIG. 9 is a perspective view of the body of the semiconductor device of FIG. 7, the waveguide being removed in this figure.
Figure 10:
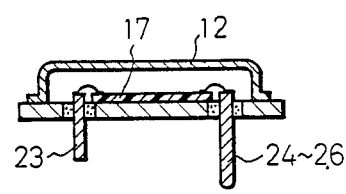
FIG. 10 is a sectional side view of the body of the semiconductor device of FIG. 9.
Figure 11:
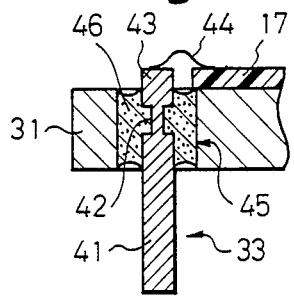
FIGS. 11 to 13 are sectional side views of the waveguide-coaxial line transformation structure according to the present invention.
Figure 12:
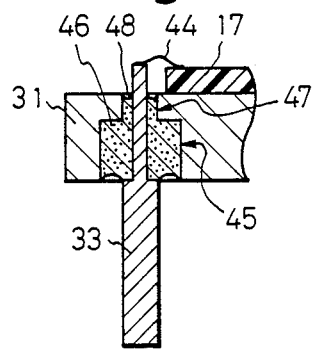
Figure 13:
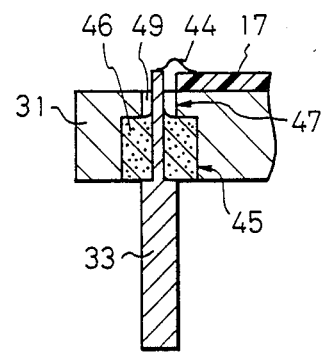

FIGS. 11 to 13 illustrate examples of a waveguide-coaxial line transformation structure according to the present invention.

In FIG. 11, a terminal 33 has an outer antenna portion 41 which receives microwave information in a waveguide 18, a transformation portion 42 which transforms the microwave information to microwave coaxial line information, and an inner end portion 43 which allows wire bonding of a large-diameter wire 44. In this structure, a hole 45 of a metal base 31 has a cylindrical configuration.

This structure is advantageous in that supersonic welding of an aluminum welding to the terminal is permitted. A usual aluminum wire has a diameter of 0.3 mm, which is larger than a usual gold wire having a diameter of 0.025 mm. This necessitates a relatively large welding top surface of the terminal 33 that is at least two times, preferably more than three times, larger than a diameter of an aluminum wire, because an aluminum wire has a diameter at the weld that is about two times larger, after welding to the top surface of the terminal, and because an oversize thereof facilitates the wire bonding therebetween. Further, if a diameter of the inner top portion 43 of the terminal 33 is small, supersonic welding, which is only one method used for wire bonding an aluminum wire, is difficult to utilize because, when supersonics are applied to an aluminum wire on the top surface of a terminal, the inner end portion of the terminal vibrates. In contrast, wire bonding of a gold wire can be conducted by simple heat compression, allowing a thin gold wire and a thin terminal. However, such gold wire bonding requires a gold plating on the surface of the top surface of the terminal where gold wire is to be bonded. However, if heat treatment is carried out for fusing glass at a high temperature, to attach the gold-plated terminal to the metal base with the fused glass, the plated gold is diffused to a degree such that bonding of the gold wire is difficult. Thus, a large inner top portion of the terminal in FIG. 11 is advantageous to permit a wire bonding of aluminum wire, reducing the manufacturing cost.

The diameter of the transformation portion 42 of the terminal 33 is reduced in comparison with the other portions 41 and 43 because, if that diameter is made larger, the diameter of the hole 45 must be made larger in order to satisfy the above-described formula for intrinsic impedance. A larger diameter of the hole 45 brings a longer distance from the terminal to the semiconductor circuit element 17, between which the aluminum wire is bridged, resulting in an undesirable radiation of microwaves. In this connection, it is noted that the semiconductor circuit element 17 should be backed with a metal member such as the base 31, to prevent the semiconductor circuit element 17 from approaching the terminal 33.

The following is an example of details of the waveguide-coaxial line transformation structure shown in FIG. 11, although this structure is not limited to this example. The package base 31 is made of a steel SPCC under Japanese Industrial Standards (JIS) and has a thickness of 2 mm and a diameter of the hole 45 of 3.29 mm. The terminal 33 is made of Koval (trade mark of an alloy of 54% Fe - 28% Ni - 18% Co). The antenna portion 41 has a diameter of 1.27 mm and a length of 7 mm, the transformation portion 42 has a diameter of 0.5 mm and a length of 0.6 mm, and the inner top portion 43 has a diameter of 1.27 mm and a length of an 8 mm. The dielectric spacer 46 is made of borosilicate glass having a dielectric constant $\epsilon$ of 5.1, and is heated at 1000° C. in an electric furnace to bond the terminal 33 to the package base 31. The specific structure is intended to be used for a microwave of 9 GHz and an impedance of 50 $\Omega$.

It is clear that the semiconductor circuit element 17 may relate to a transmitter and the transformation portion 42 of the terminal 33 transforms microwave coaxial line information to waveguide information which is released from the antenna portion 41 into the waveguide 18. Thus, the structure according to the present invention, e.g., as shown in FIG. 11, can be used for either receiving or transmitting a high frequency, e.g., microwave information.

As described above, the structure shown in FIG. 11 has an advantage in that a wire bonding of the aluminum can be carried out, but the present invention is not limited to this structure. FIGS. 12 and 13 are other preferable examples of the transformation structures, in which the hole 45 or the dielectric spacer 46 has a varied configuration to prevent a radiation of high frequency information, as much as possible. In these structures, a diameter 47 of a portion 47 of the hole near the inner lead 44 is reduced in comparison with a diameter of the rest portion of the hole 45. By reducing the diameter of the portion 47 of the hole near the inner lead 44, microwave radiation from the terminal 33 near the inner lead 44 is reduced. The difference between the structures shown in FIGS. 12 and 13 is in the dielectric materials used in the portion 47 of the hole. That is, glass is present in FIG. 12 and air is present in FIG. 13. Both glass and air are dielectric and may be used, but a diameter of the portion 47 of the hole should be adjusted depending on the dielectric constant of the dielectric materials. Although these structures do not always allow punching due to a complicated configuration of the hole, these structures still permit a reduction of the thickness of the package base, an elimination of insufficiency caused by soldering necessary in the structures of the prior art, etc.

Figure 14:
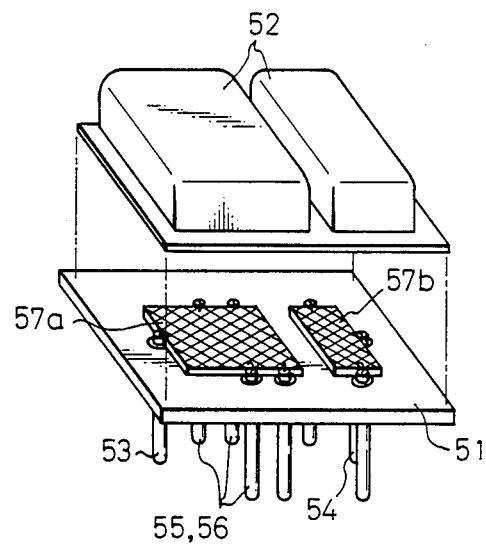
FIGS. 14 to 16 are perspective and sectional views of a preferred embodiment of a semiconductor device according to the present invention.
Figure 15:
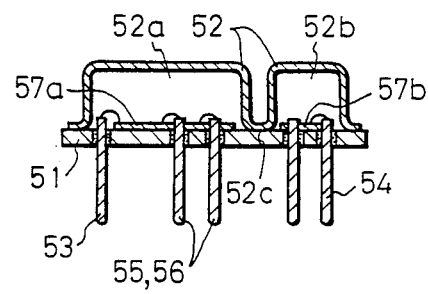
Figure 16:
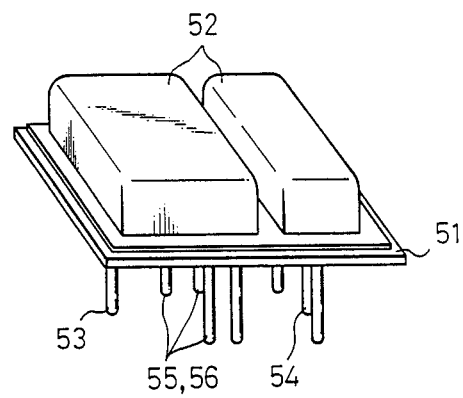

FIGS. 14 to 16 illustrate a preferred embodiment of a semiconductor device according to the present invention. In this embodiment, the semiconductor device has two semiconductor circuit elements 57a and 57b separately mounted on a metal flat base 51 of a package. Two semiconductor circuit elements 57a and 57b are, for example, an amplifying and mixing circuit element 57a and an oscillating circuit element 57b. An oscillating circuit radiates or releases electromagnetic waves and an amplifying circuit, etc., may catch the radiated or released electromagnetic waves, resulting in operation errors, a reduction of the S/N ratio, and distortion, etc. Therefore, the oscillating circuit element 57b and the amplifying and mixing circuit elements 57a should be shielded from each other to prevent electromagnetic wave interference. To this end, a metal cap 52 is formed with two cup-like small rooms 52a and 52b in which the circuit elements 57a and 57b are mounted respectively. The cup-like small rooms 52a and 52b are made by draw-pressing a metal sheet. For example, a flat sheet of SPCC having a thickness of 0.4 mm is draw-pressed to form the two cup-like small rooms 52a and 52b. The number and shapes, etc., of the cup-like small rooms 52a, 52b are defined in accordance with the number and shapes, etc., of the semiconductor circuit elements mounted on a package flat base. The flat periphery of the cap 52 is in contact with the periphery of the flat base 51, and at the periphery, the cap 52 and the base 51 are bonded. This bonding may be conducted by electrical resistance welding, laser welding or the like. Electrical resistance welding is easier when the package is small. For electrical resistance welding, an annular extrusion having a sharp edge such as an edge of a triangle is made on the lower surface of the peripheral flat surface of the cap 52, which is put on the base 51. Then an electric current is made to flow between the cap 52 and the base 51, whereby the annular extrusion is heated and fused and the cap 52 and the base 51 are bonded. This is done in an inert gas atmosphere so that an inert gas is enclosed in the package.

To prevent a release of electromagnetic waves, a complete sealing of a circuit by a metal member is important. If there is a space between the cap 52 and the base 51, electromagnetic waves will escape. A flat portion 52c of the cap 52 is in contact with the base 51 but not welded to the base 51. To prevent an escape of electromagnetic waves, the flat portion 52c is preferably extruded slightly toward the base 51 by pressing so that the flat portion 52c is pressed to the base 51 when the cap 52 is bonded to the base 51.

The terminals 53, 54, 55, 56, etc., may be similar to those described previously.

Figure 17:
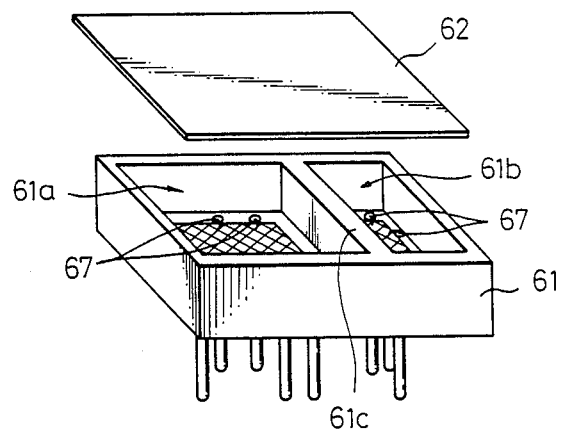
FIG. 17 is a perspective view of a semiconductor device corresponding to that in FIGS. 14 to 16 in the prior art.

The cap 52 described above can be made very easily and at a very low-cost, and when this cap 52 is used, mounting semiconductor circuit elements onto a base and interconnection thereof, etc., are made easier, and the semiconductor device is made smaller and lighter in weight. FIG. 17 shows a semiconductor device corresponding to that shown in FIGS. 14 to 16 in the prior art. As seen in FIG. 17, a base or body 61 of a package is a box or container having a plurality of rooms or recesses 61a and 61b and a wall 61c for defining the rooms 61a and 61b, and a cap 62 is a flat sheet. Such a box or container-type body of a package is made from a thick (e.g., 10 mm) metal plate by cutting. This cutting takes time and is sometimes complicated, depending on the semiconductor device. Further, assembly work such as mounting a semiconductor circuit element, wire bonding, etc., in narrow recesses is not easy and sometimes requires a special working machine. The embodiment of the present invention shown in FIGS. 14 to 16 solves these problems.

We claim:
1. A semiconductor device, comprising:
   a metal base of a package, having a hole passing through a base;
   a semiconductor circuit element mounted on the base;
   a cap of the package air-tightly fixed to the base for sealing the circuit element within the package;
   a metal terminal for waveguide-coaxial line transformation, passing through the hole of the base and having an inner end portion at which the terminal is electrically connected to the circuit element, a central transformation portion in the hole of the base, and an outer antenna portion extending toward the outside of the package; and a dielectric spacer between the terminal and the base, the terminal being air-tightly fixed directly to the base by the dielectric spacer;

wherein the hole of the base, the dielectric spacer, and the central transformation portion of the terminal are formed so as to satisfy the following formula:

$$Z_0 = \frac{60}{\epsilon} \log_e \frac{d_2}{d_1}$$

where $Z_0$ is a required inherent impedance of a characteristic frequency, $\epsilon$ is a dielectric constant of the dielectric spacer, $d_1$ is a diameter of the central transformation portion of the terminal and $d_2$ is a diameter of a portion, enclosing the central transformation portion of the terminal of the hole of the base, such that said members act as a required waveguide-coaxial line transformer.

2. A device according to claim 1, wherein the base of the package is made of a steel.

3. A device according to claim 1, wherein the hole of the base has a simple cylindrical configuration.

4. A device according to claim 1, wherein the hole of the base has a stepwise cylindrical configuration in which a portion of the hole close to the inside of the package has a smaller diameter than that of the remaining portion of the hole.

5. A device according to claim 4, wherein the dielectric spacer is present between the smaller diameter portion of the hole and the terminal as well as between said remaining portion of the hole and the terminal.

6. A device according to claim 4, wherein the dielectric spacer is present only between said remaining portion of the hole and the terminal and air is present between the smaller diameter portion of the hole and the terminal.

7. A device according to claim 1, further comprising a waveguide attached to the base of the package, the waveguide having a hole which is aligned with the hole of the base and through which the antenna portion of the terminal passes toward the inside the waveguide.

8. A semiconductor device, comprising:

a metal base of a package, having a hole passing through a base, a semiconductor circuit element mounted on the base;

a cap of the package air-tightly fixed to the base for sealing the circuit element within the package;

a metal terminal for waveguide-coaxial line transformation, passing through the hole of the base and having an inner end portion, the inner end portion extending from the inside of the hole in the base into the package and having a flat top surface and a first diameter, a central transformation portion having a second diameter in the hole of the base, and an outer antenna portion having a third diameter and extending toward the outside of the package, the first diameter being larger than the second diameter;

a wire bonded to the top surface of the inner end portion of the terminal and to the circuit element and electrically connecting the terminal with the circuit element;

a dielectric spacer between the terminal including the transformation portion and a part of the inner end portion thereof and the base, the terminal being air-tightly fixed directly to the base by the dielectric spacer;

wherein the hole of the base, the dielectric spacer, and the central transformation portion of the terminal are formed so as to satisfy the following formula:

$$Z_0 = \frac{60}{\epsilon} \log_e \frac{d_2}{d_1}$$

wherein $Z_0$ is a required inherent impedance of a characteristic frequency, $\epsilon$ is a dielectric constant of the dielectric spacer, $d_1$ is the second diameter of the central transformation portion of the terminal and $d_2$ is a diameter of a portion, enclosing the central transformation portion of the input terminal, of the hole of the base, such that said members act as a required waveguide-coaxial line transformation.

9. A device according to claim 8, wherein the hole of the base has a simple cylindrical configuration.

10. A device according to claim 8, wherein the first and third diameters of the terminal have a same diameter which is substantially larger than the second diameter.

11. A device according to claim 8, wherein the base of the package is made of a steel.

12. A device according to claim 8; wherein the dielectric spacer is made of glass.

13. A device according to claim 8, wherein the wire is made of aluminum and welded to the inner end portion of the terminal.

14. A device according to claim 13, wherein the first diameter is more than two times larger than the diameter of the aluminum wire.

15. A device according to claim 14, wherein the first diameter is more than three times larger than the diameter of the aluminum wire.

16. A device according to claim 15, wherein the aluminum wire has a diameter of about 0.3 mm.

17. A device according to claim 8, wherein $Z_0$ is about 50 $\Omega$.

18. A device according to claim 8, further comprising a waveguide attached to the base of the package, the waveguide having a hole which is aligned with the hole of the base and through which the antenna portion of the terminal passes and extends into said waveguide.

19. A device according to claim 8, designed for microwave.

20. A semiconductor device, comprising:

a metal flat base of a package, having a hole passing through the base;

a plurality of semiconductor circuit elements mounted on the flat base;

a metal cap of the package air-tightly fixed to the flat base for sealing the circuit elements within the package, the metal cap having a plurality of cup-like small rooms formed on a draw-pressed metal sheet, the cup-like small rooms forming an electromagnetic shield for each circuit element;

a metal terminal for waveguide-coaxial line transformation, passing through the hole of the base and having an inner end portion at which the terminal is electrically connected to one of the circuit elements, a central transformation portion in the hole of the base, and an outer antenna portion extending toward the outside of the package, and a dielectric spacer between the terminal and the base, the terminal being air-tightly fixed directly to the base by the dielectric spacer;

wherein the structure of the hole of the base, the dielectric spacer, and the central transformation portion of the terminal is so formed that said members act as a required waveguide-coaxial line transformer.

21. A device according to claim 1, wherein the base and cap of the package are made of a steel.

22. A semiconductor device, comprising:
a metal base of a package, having a hole passing through the base,
a semiconductor circuit element mounted on the base;
a cap of the package air-tightly fixed to the base for sealing the circuit element within the package;
a metal terminal for waveguide-coaxial line transformation, passing through the hole of the base and having an inner end portion having a flat top surface and a first diameter, a central transformation portion having a second diameter in the hole of the base, and an outer antenna portion having a third diameter and extending from the inside of the hole of the base toward the outside of the package, the first diameter being larger than the second diameter;
a wire bonded to the top surface of the inner end portion of the terminal and to the circuit element and electrically connecting the terminal with the circuit element;
a dielectric spacer between the terminal including the transformation portion and a part of the inner end portion thereof and the base, the terminal being air-tightly fixed directly to the base by the dielectric spacer;

wherein the whole of the base, the dielectric spacer, and the central transformation portion of the terminal are formed in order to satisfy the following formula:

$$Z_0 = \frac{60}{\epsilon} \log_e \frac{d_2}{d_1}$$

where $Z_0$ is a required inherent impedance of a characteristic frequency, is a dielectric constant of the dielectric spacer, $D_1$ is a diameter of the central transformation portion of the terminal and $d_2$ is a diameter of a portion, enclosing the central transformation portion of the terminal of the hole of the base, such that said members act as a required waveguide-coaxial line transformer.

23. A device according to claim 22, wherein said inner end portion of said terminal extends from the inside of said hole into said package.

* * * * *